US008975618B2

(12) United States Patent
Dimmock et al.

(10) Patent No.: US 8,975,618 B2
(45) Date of Patent: Mar. 10, 2015

(54) ENERGY CONVERSION DEVICE WITH SELECTIVE CONTACTS

(75) Inventors: James Andrew Robert Dimmock, Oxford (GB); Stephen Day, Norton (GB); Matthias Kauer, Oxford (GB); Jonathan Heffernan, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 682 days.

(21) Appl. No.: 13/075,366

(22) Filed: Mar. 30, 2011

(65) Prior Publication Data

US 2012/0248413 A1    Oct. 4, 2012

(51) Int. Cl.
| | |
|---|---|
| *H01L 31/072* | (2012.01) |
| *H01L 31/055* | (2014.01) |
| *B82Y 20/00* | (2011.01) |
| *H01L 31/0352* | (2006.01) |
| *H01L 31/052* | (2014.01) |

(52) U.S. Cl.
CPC ............... *H01L 31/055* (2013.01); *B82Y 20/00* (2013.01); *H01L 31/035236* (2013.01); *H01L 31/0524* (2013.01); *Y02E 10/52* (2013.01); *Y02E 10/544* (2013.01)
USPC ............................................. 257/25; 257/104

(58) Field of Classification Search
None
See application file for complete search history.

(56) References Cited

U.S. PATENT DOCUMENTS 5,588,015 A * 12/1996 Yang ........................ 372/45.012

FOREIGN PATENT DOCUMENTS

JP    04324214    9/2009

OTHER PUBLICATIONS

M.A. Green, "*Third Generation Photovoltaics: Advanced Solar Energy Conversion*", Springer (Dec. 2005).
P. Würfel et al, "*Progress in Photovoltaics: Research and Applications*", 13[4] 277-285 (Jun. 2005).
Robert T. Ross et al., "*Efficiency of Hot-carrier Solar Energy Converters*", Journal of Applied Physics, 53[5] 3813-3818 (May 1982).
P. Würfel, "Solar Energy Materials & Solar Cells", 46 (Apr. 1997) 43-52.
G. Conibeer et al, "Solar Energy Materials & Solar Cells 93" (Jun. 2009) 713-719.
S. Yagi and Y. Okada, "*Fabrication of resonant tunneling structures for selective energy contact of hot carrier solar cell based on III-V semiconductors*", Photovoltaic Specialists Conference (PVSC), 2010 35th IEEE, 1213-1216 (Jun. 2010).
H. Mizuta and T. Tanoue, "*The Physics and Applications of Resonant Tunnelling Diodes*", Cambridge University Press (1995).

(Continued)

*Primary Examiner* — Matthew W Such
*Assistant Examiner* — Abul Kalam
(74) *Attorney, Agent, or Firm* — Renner, Otto, Boisselle & Sklar, LLP.

(57) ABSTRACT

A resonant tunneling device includes a first semiconductor material with an energy difference between valence and conduction bands of $E_{g1}$, and a second semiconductor material with an energy difference between valence and conduction bands of $E_{g2}$, wherein $E_{g1}$ and $E_{g2}$ are different from one another. The device further includes an energy selectively transmissive interface connecting the first and second semiconductor materials.

19 Claims, 9 Drawing Sheets

(56) References Cited

OTHER PUBLICATIONS

A.J. Nozik, "*Spectroscopy and Hot Electron Relaxation Dynamics in Semiconductor Quantum Wells and Quantum Dots*", Annual Review Physical Chemistry (2001) 52:193-231.

A. J. North et al., "*Electron reflection and interference in the GaAs/AlAs—Al Schottky collector resonant-tunneling diode*", Physical Review B, 57, 1847-1854 (1998).

\* cited by examiner

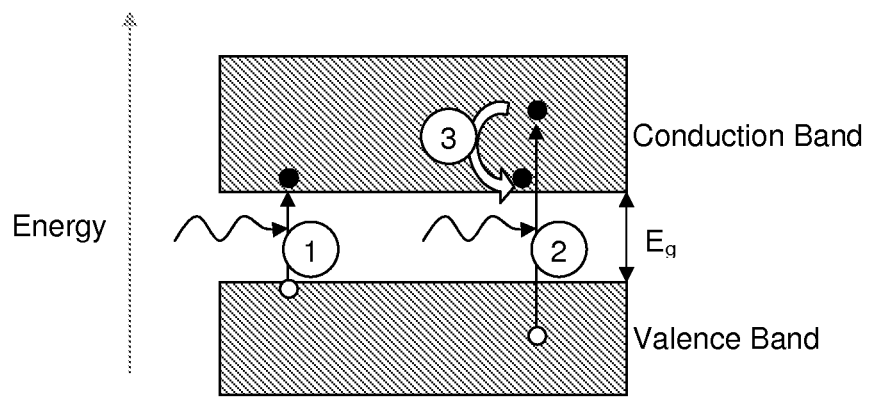
**Figure 1
(Conventional)**

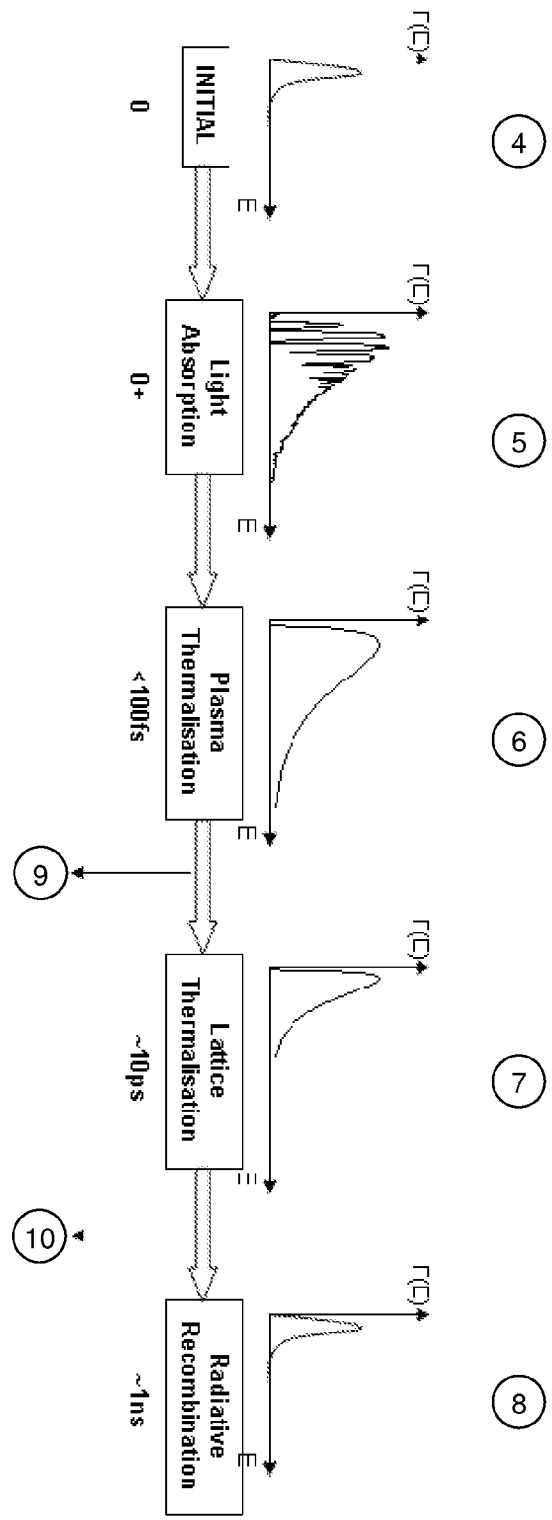
Figure 2
(Conventional)

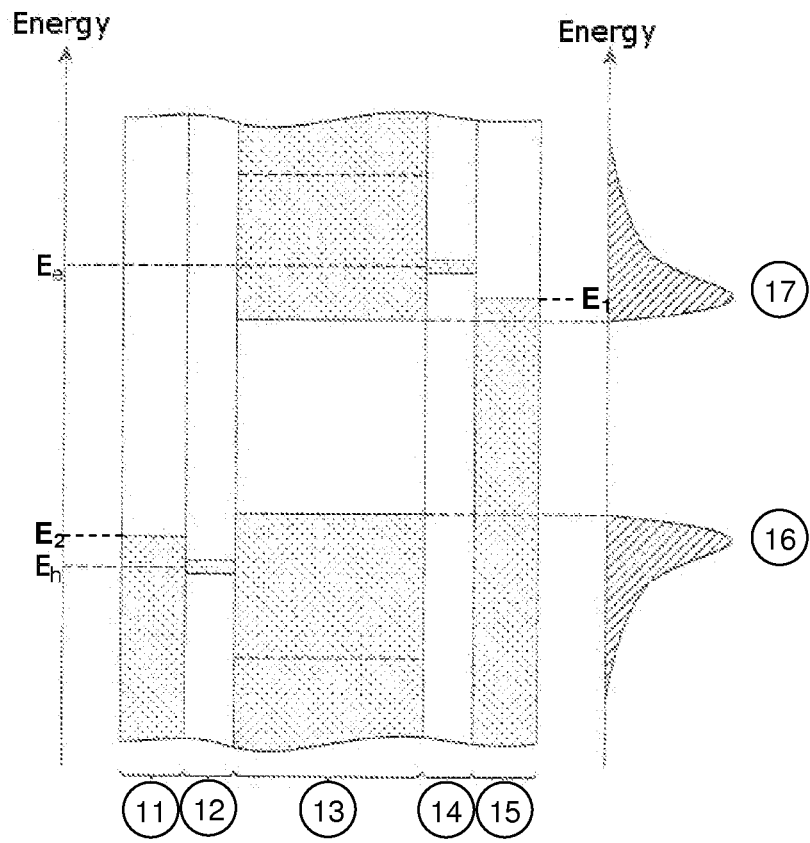
**Figure 3
(Conventional)**
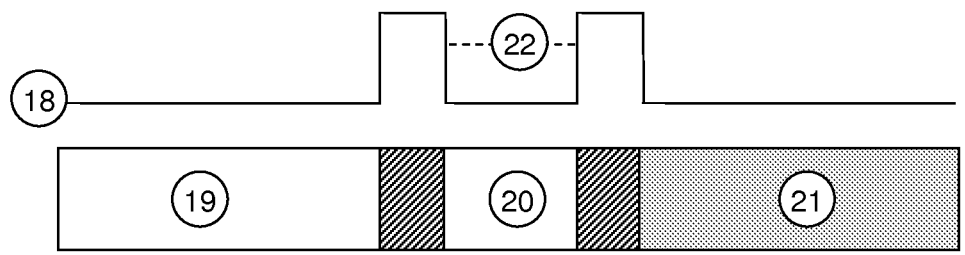
**Figure 4
(Conventional)**

ENERGY CONVERSION DEVICE WITH SELECTIVE CONTACTS

TECHNICAL FIELD

The present invention relates to the conversion of solar energy into electricity. More particularly, the present invention relates to the absorption of solar energy and its conversion to electricity by an intermediate step which narrows the energy distribution of the energy carriers in the system.

BACKGROUND ART

A standard, single-junction photovoltaic cell can only be 31% efficient under AM1.5G conditions (40% under full concentration). This is due to the cell's inability to absorb photons with energy below its band gap and the fact that if a photon has energy in excess of the band gap, all additional energy is lost to the lattice as heat. FIG. 1 shows a photon being absorbed with energy equal to the band gap energy 1 and a photon being absorbed with energy greater than the band gap energy 2 and losing the additional energy as heat to the lattice 3.

Several approaches have been made to solve this problem: multi-junction cells, intermediate band cells, multiple exciton generating cells and hot carrier cells [all summarised in M. A. Green, *Third Generation Photovoltaics: Advanced Solar Energy Conversion*, Springer (December, 2005)]. The most successful approach has been the multi-junction cell, which has a plurality of semiconductor absorbing layers each with a different band gap. This is designed so that photons of different energies are absorbed in different layers of the cell such that the photon energy is well matched to the layer band gap and the photon energy in excess of the band gap, which is lost as heat, is minimised. However, such devices are expensive due to the difficulty of growing different semiconductor layers with optimal band gaps on top of each other.

The structure presented herein is most closely associated with the hot-carrier solar cell; an overview of the concept of the hot carrier solar cell can be found in Würfel's paper [P. Würfel et al, Progress in Photovoltaics: Research and Applications, 13[4] 277-285 (June, 2005)]. FIG. 2 shows the process by which light is absorbed in a semiconductor and creates a distribution of lattice thermalised electrons in the semiconductor's conduction band. Initially the only electrons in the conduction band are those that are thermally excited from the valence band (graph 4). After excitation with a spectrum of light with photons of different energies, electrons are excited into the conduction band of the semiconductor (graph 5), and have energies in excess of the conduction band minimum ($\Delta E_e$) determined by the difference between the photon energy (hv) and the semiconductor band gap ($E_g$) and the relative electron and hole masses ($m_e, m_h$) (Equation 1).

$$\Delta E_e = (hv - E_g)\left(1 + \frac{m_e}{m_h}\right)^{-1} \quad \text{Equation 1}$$

This non-thermal distribution of electrons thermalises by electron-electron collisions on a timescale of less than 100 fs (graph 6), at which point the electron distribution can be described by a Fermi distribution (Equation 2) with a temperature (T) well in excess of the lattice temperature.

$$n_e(E) = g(E)\left(1 + e^{\frac{E-\mu}{kT}}\right)^{-1} \quad \text{Equation 2}$$

This hot electron distribution then interacts with phonons and loses energy to the lattice on a timescale of 10 ps (graph 7). These lattice thermalised electrons then de-excite to the valence band of the semiconductor on a timescale of nanoseconds (graph 8) often emitting photons in the process. This process also happens analogously for the hole distribution in the valence band, with similar steps of hole-hole thermalisation and lattice thermalisation.

In a standard single band-gap solar cell, electrons are extracted from the bottom of the conduction band at location 10; i.e. after they have thermalised with the lattice and lost energy. The principle of a hot carrier solar cell is to extract them at location 9 in order to use the extra energy that would otherwise be lost by lattice thermalisation. This was first proposed in theory in 1982 [Robert T. Ross et al., "*Efficiency of Hot-carrier Solar Energy Converters*", Journal of Applied Physics, 53[5] 3813-3818 (May, 1982)] and several other publications and patents have followed in a similar vein e.g.:

P. Würfel, Solar Energy Materials & Solar Cells, 46 (April, 1997)43-52: A theoretical paper extending the principle of the hot-carrier solar cell to include impact ionisation events. This reference describes energy selective "membrane" materials with "a large band gap, small bandwidth" through which contact is made. This is now exclusively realised by a resonant tunneling contact whose discrete energy levels provide an effective large band gap (due to confinement) small bandwidth contact. Extraction (tunneling) is implicitly into a metal in the structure in this paper.

G. Conibeer et al, Solar Energy Materials & Solar Cells 93 (June, 2009) 713-719: Experimental work showing resonant tunneling in Si QDs embedded in Silicon Oxide. The emitter and collector are identical (n-Si) and this is carried out with lattice thermalised carriers, but the stated aim is to use this structure for an energy selective contact.

JP04324214—PHOTOVOLTAIC FORCE DEVICE— September 2009: This reference discloses a hot carrier solar cell similar to that shown in the non-patent literature by e.g. R. T. Ross and P. Würfel, with the primary difference that JP04324214 explicitly states that the absorber layer should contain impurities (n-type or p-type) such that the majority carriers in the absorber layer will remain at substantially the same temperature upon illuminating the absorber layer with light in excess of its band gap. The aim of this device is then to selectively tunnel these low temperature majority carriers in to a contact region.

Such devices work by extracting carriers at one particular energy (optimally the average energy) from a broad energy distribution of carriers. This extraction must happen faster than the rate of lattice thermalisation, but preferably slower than the rate of carrier thermalisation so that the energy state from which the carriers tunnel is re-populated. This isn't a strict necessity, but if the tunneling rate is faster than the carrier thermalisation then the distribution of carriers reaching the contact will be energetically wider than if the carrier thermalisation is faster than the tunneling. Hence the efficiency of such a device is higher if the carrier thermalisation rate is faster than the tunneling rate due to a lower thermalisation loss in the contacts.

In all such papers and patents the method of hot carrier extraction is via energy selective tunneling. With further reference to FIG. 3, this is brought about by placing quantum well layers 12 and 14 adjacent to the absorber layer 13 such that tunneling of carriers occurs through the discrete energy states of the wells. The tunneling explicitly or implicitly occurs directly into electrical contacts 11 and 15. In the exemplary device of FIG. 3, carriers are photo-generated in the absorber layer 13 to form hot carrier distributions 16 and 17, from which carriers then selectively tunnel into the contacts 11 and 15 at energies $E_h$ and $E_e$ respectively No device has yet been constructed whereby hot carrier selective tunneling has taken place from a semiconductor into a contact with a higher Fermi level than the semiconductor. However, tentative evidence for hot carrier selective tunneling between two identical semiconductor regions has been presented by S. Yagi [S. Yagi and Y. Okada, *Fabrication of resonant tunneling structures for selective energy contact of hot carrier solar cell based on III-V semiconductors*, Photovoltaic Specialists Conference (PVSC), 2010 35th IEEE, 1213-1216 (June, 2010)]. The structure used by S. Yagi is similar to FIG. 4, and so is not suitable for use in a hot carrier photovoltaic cell, since lattice thermalisation of the carriers would happen in the absorber layer 21 after tunneling. However, it does show tentative proof of principle that selective tunneling of hot carriers can occur between two regions faster than lattice thermalisation.

SUMMARY OF INVENTION

All devices disclosed in the identified prior art that extract carriers from a semiconductor at one particular energy employ resonant tunneling. Furthermore this resonant tunneling explicitly or implicitly takes place directly into a metal electrical contact. This can be problematic as the Fermi level in the metal needs to be significantly below the resonant tunneling energy, so there are empty states to tunnel in to. However, this will result in a high thermalisation loss when the hot electrons tunnel into the metal. This is shown in FIG. 3 (from JP04324214) where the electrons are extracted at energies $E_h$ and $E_e$ into the contacts but then must fall to energies $E_1$ and $E_2$, respectively.

Contrarily, if the Fermi level in the metal is close to the resonant tunneling energy then significant tunneling from the metal to the absorber layer will occur (opposite to the desired direction: "back-tunneling"), resulting in a reduced output current for the device. Furthermore if such a device is biased, so as to extract power from the tunnel current, this will increase the back-tunneling significantly if the Fermi level in the metal acceptor is close to the resonant energy. Because of this contacting problem no device in the literature provides a structure to efficiently use hot-carriers that are photo-generated in a semiconductor.

A device and method in accordance with the present invention provide a structure which will extract an energetically narrow distribution of electrons from an energetically broad distribution using resonant tunneling. The device and method maintain the average electron energy but provide an increase in conduction band minimum energy.

In accordance with the present invention, carriers in a semiconductor at a carrier temperature in excess of the lattice temperature are extracted over a narrow range of energies into a second semiconductor with a larger band gap. This results in a carrier distribution in the second semiconductor at an increased conduction band minimum energy but a reduced temperature.

This narrowed distribution, at an increased conduction band minimum energy, can be extracted electrically or recombined radiatively. If the narrowed distribution is extracted electrically this could be used in a hot carrier solar cell. If the narrowed distribution is recombined radiatively the resulting narrowband emission can be used to illuminate a photovoltaic cell.

Advantages of a device in accordance with the present invention include the following:

The average energy of the carriers will be maintained but the carrier temperature will decrease. It will result in a thermalised distribution of carriers in a wide band gap semiconductor.

There will be low back-tunneling from the contact since the tunneling is directly into another semiconductor which (if doped appropriately) will have no carriers in its conduction band at the resonant energy thereby making back-tunneling impossible.

There will be low thermalisation in the contact since the tunneling is directly into a region near the conduction band minimum of a semiconductor with a wider band gap.

According to one aspect of the invention, a resonant tunneling device includes: a first semiconductor material with an energy difference between valence and conduction bands of $E_{g1}$; a second semiconductor material with an energy difference between valence and conduction bands of $E_{g2}$, wherein $E_{g1}$ and $E_{g2}$ are different from one another; and an energy selectively transmissive interface connecting the first and second semiconductor materials.

According to one aspect of the invention, one of the first or second semiconductor materials comprises an emitter material and the other of the first or second semiconductor materials comprises an acceptor material, and the energy difference between the valence and conduction bands for the emitter material is less than the energy difference between the valence and conduction bands for the acceptor material.

According to one aspect of the invention, at a resonant energy level, the acceptor material does not have carriers in the conduction band.

According to one aspect of the invention, an electron mass of the acceptor material is greater than an electron mass of the emitter material.

According to one aspect of the invention, the emitter material absorbs light and generates electrons and holes.

According to one aspect of the invention, when electrons are a non-majority carrier, a conduction band edge of the emitter material has a lower energy than a conduction band edge of the acceptor material, and when holes are the non-majority carrier, the valence band edge of the emitter material has a higher energy than the valence band edge of the acceptor material.

According to one aspect of the invention, when electrons are the non-majority carrier the energy selectively transmissive interface provides an energy level that supports resonant tunneling at an electron energy greater than the conduction band edge of the acceptor material, and when holes are the non-majority carrier the energy selectively transmissive interface provides an energy level that supports resonant tunneling at a hole energy less than the valence band edge of the acceptor material.

According to one aspect of the invention, a non-majority carrier band edge of the acceptor material is substantially aligned to an average non-majority hot carrier energy in the emitter material.

According to one aspect of the invention, a size of the emitter material is smaller than a hot thermalization length from a region where energy selective extraction takes place.

According to one aspect of the invention, the acceptor material suppresses radiative recombination.

According to one aspect of the invention, a resonant tunneling energy and a non-majority band edge of the acceptor material are substantially aligned.

According to one aspect of the invention, the energy selectively transmissive interface comprises a first barrier layer arranged adjacent to the first semiconductor material, a second barrier layer arranged adjacent to the second semiconductor material, and a quantum well layer arranged between the first and second barrier layers.

According to one aspect of the invention, a minority carrier effective mass is substantially less than a majority carrier effective mass for the semiconductor material that absorbs light.

According to one aspect of the invention, a valence and/or conduction band of the first semiconductor material is offset from a respective valence or conduction band of the second semiconductor material.

According to one aspect of the invention, the first semiconductor material is p-doped, the second semiconductor material is n-doped and $E_{g1}$ is less than $E_{g2}$.

According to one aspect of the invention, carriers are electrically extracted from the first and second semiconductor material to an external circuit.

According to one aspect of the invention, the energy selectively transmissive interface is arranged between the first and second semiconductor materials.

According to one aspect of the invention, the emitter and acceptor materials are substantially undoped, and the acceptor region is a direct band-gap material having a structure that supports efficient radiative recombination.

According to one aspect of the invention, the emitter material comprises InAs and the acceptor material is a quaternary material.

According to one aspect of the invention, an offset between the valance bands of the semiconductor materials is selected to enable direct hole transport without tunneling.

According to one aspect of the invention, the device includes a layer of quantum dots as the energy selectively transmissive interface, According to one aspect of the invention, the emitter material and acceptor material are formed as a cylinder.

According to one aspect of the invention, the device includes an energy selective contact arranged between a p-doped emitter material and an n-doped acceptor material.

According to one aspect of the invention, carriers are electrically extracted from the acceptor material.

According to one aspect of the invention, the first semiconductor material is InAs and the second semiconductor material is $In_xAl_{1-x}As_ySb_{1-y}$.

According to one aspect of the invention, the energy selectively transmissive interface is a quantum well of InAs between two layers of AlSb.

According to one aspect of the invention, the energy selective transmissive interface comprises a stack of energy selective transmissive interfaces.

According to one aspect of the invention, a photovoltaic device includes: a photovoltaic cell; and the resonant tunneling device described herein, wherein the device is coupled to the photovoltaic cell so as to illuminate the photovoltaic cell with light of an energy substantially matched to a band gap of the photovoltaic cell.

According to one aspect of the invention, a broadband radiation spectrum incident on the resonant tunneling device is converted by the resonant tunneling device to a substantially monochromatic spectrum.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

In the annexed drawings, like references indicate like parts or features:

FIG. 1 Absorption of a photon in a semiconductor with band gap equal to photon energy 1 and less than photon energy 2

FIG. 2 The process of light absorption in a semiconductor and how it affects the conduction band electron population. The graphs show the electron density distribution ($\Gamma(E)$) as a function of electron energy (E) in excess of the conduction band minimum.

FIG. 3 A schematic of the prior art hot carrier solar cell

FIG. 4 A prior art resonant tunneling diode

DESCRIPTION OF REFERENCE NUMERALS

Figure 5A:
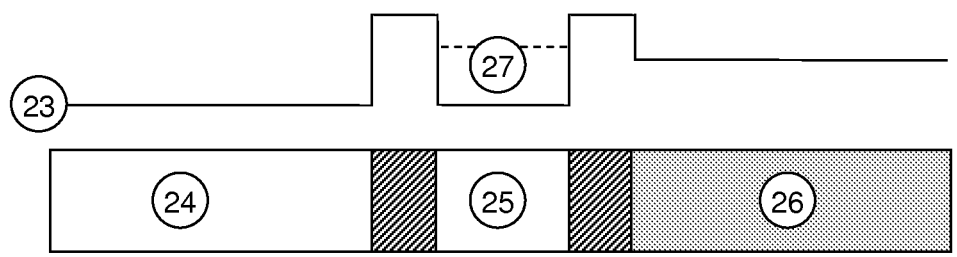
FIG. 5a A resonant tunneling structure of a device in accordance with the present invention with an offset conduction band in the acceptor material FIG. 5b A resonant tunneling structure of a device in accordance with the present invention with an offset valence band in the acceptor material FIG. 6 The carrier density in the different regions of the resonant tunneling structure of a device in accordance with the present invention when illuminated with light and the transmission probability as a function of electron energy.

1. Photon exciting electron from valence band to conduction band
2. Photon exciting electron from valence band to conduction band
3. High energy conduction band electron losing extra energy to lattice
4. Thermal electron distribution in the conduction band of a semiconductor
5. Electron distribution in the conduction band of a semiconductor after illumination with a spectrum of light
6. Electron distribution in the conduction band of a semiconductor after carrier thermalisation
7. Electron distribution in the conduction band of a semiconductor after lattice thermalisation
8. Electron distribution in the conduction band of a semiconductor after radiative recombination
9. Extraction of electrons before lattice thermalisation can occur
10. Extraction of electrons after lattice thermalisation has occurred
11. Hole contact layer
12. Hole energy selective contact
13. Light absorption region
14. Electron energy selective contact
15. Electron contact layer
16. Hot hole distribution
17. Hot electron distribution
18. Conduction band profile of a prior art RTD
19. Emitter layer of a prior art RTD
20. Well layer of a prior art RTD
21. Acceptor layer of a prior art RTD
22. Resonant energy level of a prior art RTD
23. Conduction band profile of the resonant tunneling structure of a device in accordance with the present invention
23b. Valence band profile of the resonant tunneling structure of a device in accordance with the present invention
24. Emitter material in the resonant tunneling structure of a device in accordance with the present invention
24b. Emitter material in the resonant tunneling structure of a device in accordance with the present invention (p-type variation)
25. Well layer in the resonant tunneling structure of a device in accordance with the present invention
25b. Well layer in the resonant tunneling structure of a device in accordance with the present invention (p-type variation)
26. Acceptor material in the resonant tunneling structure of a device in accordance with the present invention
26b. Acceptor material in the resonant tunneling structure of a device in accordance with the present invention (p-type variation)
27. Resonant electron energy level in the resonant tunneling structure of a device in accordance with the present invention
27b. Resonant hole energy level in the resonant tunneling structure of a device in accordance with the present invention (p-type variation)
28. Hot electron distribution in the emitter material
29. Transmission probability as a function of electron energy
30. Electron distribution in the acceptor material
31. Band gap in the emitter material
32. Band gap in the acceptor material
33. Region of light absorption (emitter material)
34. Quantum Dot providing discrete energy level for transmission
35. Barrier layer providing confinement of quantum dot
36. Acceptor material
37. Cap to nanowire, providing light shading
38. Concentric well providing discrete energy level for transmission
39. Emitter material in the resonant tunneling structure of a device in accordance with the present invention (p-i-n variation)
40. Well layer in the resonant tunneling structure of a device in accordance with the present invention (p-i-n variation)
41. Acceptor material in the resonant tunneling structure of a device in accordance with the present invention (p-i-n variation)
42. Resonant electron energy level in the resonant tunneling structure of a device in accordance with the present invention (p-i-n variation)
43. Conduction band profile of the resonant tunneling structure of a device in accordance with the present invention (p-i-n variation)
44. Conduction band profile of the resonant tunneling structure of a device in accordance with the present invention (p-i-n variation)
45. Hot electron distribution in the p-type emitter material
46. Resonant electron energy level in the resonant tunneling structure of a device in accordance with the present invention (p-i-n variation)
47. Conduction band of the n-type acceptor material
48. Broadband light input
49. Concentrator optic (e.g., lens)
50. The resonant tunneling structure of a device in accordance with the present invention which emits substantially monochromatic light
51. The resonant tunneling structure of a device in accordance with the present invention which emits substantially monochromatic light [Magnified]
52. Substantially monochromatic light
53. A photovoltaic cell with a band gap matched to the substantially monochromatic light 52 from the resonant tunneling structure of a device in accordance with the present invention 50

DEFINITION OF TERMS

Band Gap: Energetic gap between the valence band and conduction band of a semiconductor.

Fermi Energy: The highest energy occupied electron state at absolute zero temperature. Heating the electron distribution results in a spreading of the electrons by $\sim k_b T$ around this energy.

Carrier Thermalisation: carrier-carrier scattering redistributes the energy of the carriers. Once they have scattered sufficiently their energetic distribution will tend to a Fermi distribution whereby the probability of a given carrier energy level being occupied is given by the Fermi energy and a temperature; in this state they are deemed "thermalised".

Lattice Thermalisation: carrier-phonon scattering reduces the temperature of the carrier distribution such that the temperature of the carrier distribution is equal to that of the lattice. This transfers energy from the carriers to the lattice.

Thermalisation length: length over which carriers thermalise with the lattice (determined by the lattice thermalisation rate and the carrier velocity).

Hot carriers: carriers with a temperature in excess of the lattice temperature.

Resonant Tunneling Diode (RTD): A semiconductor device comprising two doped semiconductors either side of a quantum well region (comprising two thin layers of a higher band gap semiconductor surrounding a thin layer of a lower band gap semiconductor). Such a device allows tunneling between the doped semiconductor layers for carriers with the same energy as the energy levels of the quantum well.

Emitter: The region or material in a resonant tunneling diode from which carriers tunnel.

Acceptor: The region or material in a resonant tunneling diode to which carriers tunnel.

Resonance (resonant carrier transfer): reflectionless transmission of carriers occurring between two quantum states, often for a defined energy range over which there is a greater than 50% chance of transmission from one state to the other.

Alignment: sufficient energy matching of two (or more) energy states such that resonant carrier transfer is possible from one energy state to the other.

DETAILED DESCRIPTION OF INVENTION

As discussed above, all devices disclosed in the identified prior art that extract carriers from a semiconductor at one particular energy employ resonant tunneling. Furthermore, this resonant tunneling explicitly or implicitly takes place directly into a metal electrical contact. This is a problem as the Fermi level in the metal needs to be significantly below the resonant tunneling energy, which will result in a high thermalisation loss when the hot electrons tunnel into the metal. If the Fermi level in the metal is close to the resonant tunneling energy then significant tunneling from the metal to the absorber layer will occur (opposite to the desired direction: "back-tunneling"), resulting in a reduced output current for the device. Furthermore, if such a device is biased so as to extract power from the tunnel current, this will increase the back-tunneling significantly if the Fermi level in the metal acceptor is close to the resonant energy.

A device and method in accordance with the present invention provide a solution to the above problem. More particularly, a resonant tunneling structure is formed in which tunneling occurs from a low band gap to a high band gap semiconductor material, the two semiconductor materials connected by an energy selective transmissive interface (e.g., tunneling occurs from a first semiconductor material having an energy difference between valence and conduction bands of $E_{g1}$ to a second semiconductor material having an energy difference between valence and conduction bands of $E_{g2}$, where $E_{g1}$ and $E_{g2}$ are different from one another, whereby an energy selectively transmissive interface only allows tunneling over a range of energies narrow in comparison with the distribution of carrier energies in the emitter). For a thermalised distribution of carriers in the emitter, as defined in the definition of terms, the distribution of carriers is of a width $k_B T_e$ (where $T_e$ is the electron temperature in the emitter) and the energy selectivity of transmission through the interface is narrower than $k_B T_e$ and more preferably narrower than $k_B T_e/10$.

In a conventional resonant tunneling diode a quantum well is incident between two identical semiconductors, which are n-doped. The discrete energy states in the well are the energies for which selective tunneling can occur between the two semiconductors. A schematic of such a conventional device is shown in FIG. 4. Line 18 shows the conduction band profile for an RTD with a schematic of the material layer structure beneath. Section 19 is the emitter, which has a conduction band offset from the barriers confining the well 20 resulting in discrete energy levels in the well. This allows only electrons with energies equal to the discrete well state 22 to tunnel from the emitter 19 to the matched acceptor 21. A detailed description of resonant tunneling and its use in resonant tunneling diodes can be found in Mizuta's book [*The Physics and Applications of Resonant Tunnelling Diodes*, H. Mizuta and T. Tanoue, Cambridge University Press (1995)]

Figure 6:
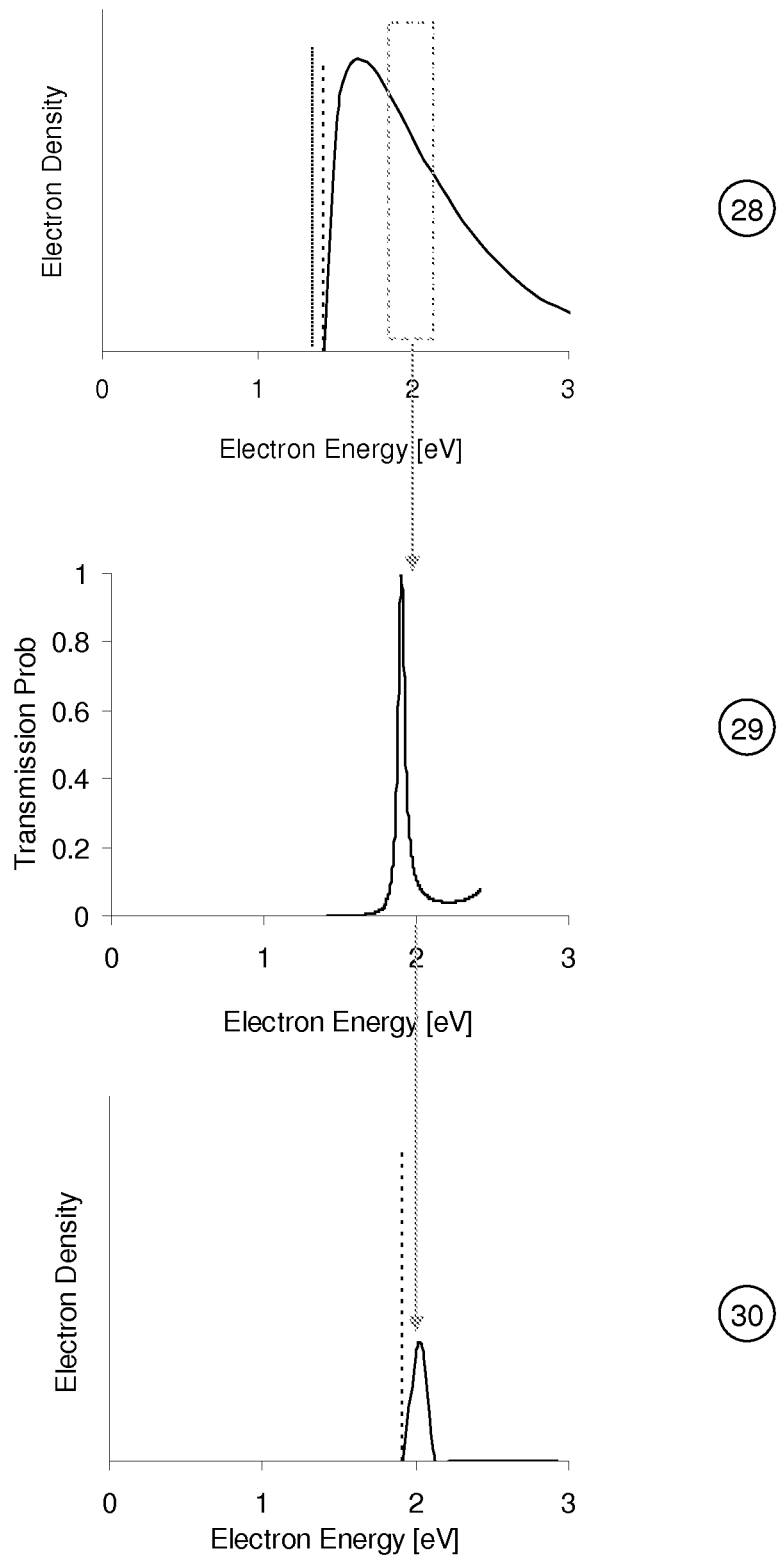

Referring to FIGS. 5*a* (conduction band tunneling structure, with conduction band profile 23) and 5*b* (valence band tunneling structure, with valence band profile 23*b*), in the device in accordance with the present invention, the semiconductor materials on either side of the energy selectively transmissive interface (a quantum well layer) are different, such that the energy gap between the valence band and conduction band in the emitter material 24, 24*b* is smaller than the energy gap between the valence band and conduction band in the acceptor material 26, 26*b* on the other side of the energy selective transmissive interface 25, 25*b*. This is shown schematically in FIG. 5*a*, which shows the conduction band-structure of the proposed device above the material layer structure, and FIG. 6, which shows the carrier density and transmission probability as a function of carrier energy. FIGS. 5*a* and 6 are illustrative of an exemplary device whose emitter material is made of GaAs 24, barriers are made of AlAs surrounding a GaAs well 25 and acceptor material of a higher band gap material such as an alloy of $Al_xGa_{1-x}As$ 26.

The exemplary device is designed to work as follows. Light incident on the emitter material 24 (24*b*) will create a hot carrier distribution in the emitter material 24 (24*b*). Fast, energy selective tunneling will occur through the well structure 25 (25*b*) for electrons (holes) that are resonant with the energy levels of the well 27 (27*b*). [This tunneling actually has an energetic spread due to the non-infinite potential barriers, so the transmission probability as a function of electron energy (above the valence band maximum) for the example device is shown in graph 29]. Energy selective tunneling in to the $Al_xGa_{1-x}As$ will populate its conduction band with thermalised carriers graph 30. The average energy of the electrons is maintained in the transition from the emitter distribution (graph 28) to the acceptor distribution (graph 30) but the conduction band minimum energy is increased due to the selective tunneling. This thermal distribution of carriers (graph 30) can then be extracted as an electrical current to an external circuit or recombined radiatively in order to produce monochromatic light at the average energy of the broadband light input incident on the device.

Both the tunneling rate of carriers leaving the emitter material 24 and the electron-electron interactions that occur to re-populate the energy level from which carriers are being selectively extracted are faster than the rate of lattice thermalisation. This is entirely possible as electron-electron interactions can thermalise an electron distribution within ~100 fs, while lattice thermalisation takes longer than 1 ps (and depends on the energy of the electron distribution and the temperature of the lattice) [both rates from A. J. Nozik, *Spectroscopy and Hot Electron Relaxation Dynamics in Semiconductor Quantum Wells and Quantum Dots*, Annual Review Physical Chemistry (2001) 52:193-231]. The Tunneling rate is dependent on the width of the transmission probability (graph 29) and can be on a similar time-scale to the carrier thermalisation [e.g. A. J. North et al., *Electron reflection and*

*interference in the GaAs/AlAs-Al Schottky collector resonant-tunneling diode*, Physical Review B, 57, 1847-1854 (1998)].

In accordance with the present invention the problem of back-tunneling from or thermalisation in the contact as described earlier is solved, since the tunneling is directly into another semiconductor material (e.g., the acceptor material) that (if doped appropriately) will have no carriers in its conduction band at the resonant energy, thereby making back-tunneling impossible.

The tunneling carriers are not the majority carriers in the emitter material 24 where the light is absorbed. This maintains a hot carrier distribution, as if a higher proportion of impurity created carriers exists, compared with photo-generated carriers, then the temperature of the carrier distribution will be significantly reduced due to fast carrier thermalisation of the hot photo-generated carriers with the cold impurity created carriers. This lower carrier temperature will mean there will be too few carriers at the resonant energy level for efficient extraction. For example, for a device which is designed to tunnel hot-electrons from the conduction band of an emitter material 24 to the conduction band of an acceptor material 26 the emitter material should be substantially undoped or p-doped but not significantly n-doped. I.e. for a conduction band tunneling device the concentration of n-type impurity dopants in the emitter material 24 should preferably be less than the concentration of photo-generated electrons ($\rho$), given by equation 3:

$$\rho = \tau \int_{\lambda min}^{\lambda max} d\lambda \frac{(1 - e^{-\alpha(\lambda)\Delta})I_0(\lambda)}{\Delta} \quad \text{Equation 3}$$

Where $\alpha(\lambda)$ is the absorption coefficient, $I_0(\lambda)$ is the light intensity in a particular wavelength range $\lambda \rightarrow \lambda+d\lambda$, $\Delta$ is the light absorption depth and $\tau$ is the carrier extraction time. This will ensure that the proportion of photo-generated electrons in the conduction band is larger than the proportion of impurity created electrons and thus maintain a high temperature.

For the device to be as efficient as possible the carrier mass for the band containing the hot carrier distribution needs to be significantly smaller than the carrier mass for the other band [e.g., if electrons are used as hot carriers in the conduction band, then the electron mass needs to be smaller than the hole mass in the light absorbing region (emitter material 24)]. This is a consequence of equation 1 which shows that the extra energy available from the absorption of a photon with energy in excess of the band gap is split between the electron and hole in inverse proportion to their masses; preferably the electron mass should be less than half of the hole mass such that more than two-thirds of the excess energy is in the electron distribution. In our example devices we have assumed that this mass difference is such that the electron mass is significantly lighter than the hole mass so the conduction band receives most of the excess energy and thence has the hot carrier distribution [e.g., InAs has $m_e:m_h=1:18$ so 95% of the excess photon energy goes to the conduction band]. However this is an arbitrary decision and similar devices could be constructed for which the hot carrier distribution be formed in the valence band and energy selective tunneling of holes be used to narrow the distribution.

Figure 7:
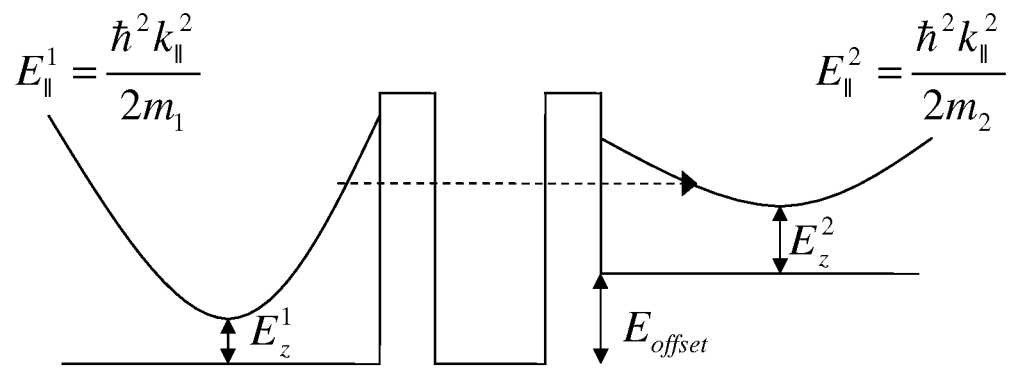
FIG. 7 A schematic showing a heavier electron mass in the acceptor material of the resonant tunneling structure of a device in accordance with the present invention in order to get energy and momentum conservation at the resonant energy level.

The best operation of this device will be obtained with an emitter material whose band gap is as low as possible (so as to maximally absorb light of all wavelengths, e.g. a band gap less than 1.16 eV allows for absorption of over half the power of the solar spectrum) and with an acceptor material whose conduction band minimum is such that it aligns in energy with the average electron energy of the hot carrier distribution photo-generated in the emitter material. Strictly this alignment will not take place for the band-minimum since momentum in addition to energy needs to be conserved in the device; so an optimum acceptor material need have not only a wider band gap but also a heavier electron mass than the emitter material. This heavier electron mass ensures that energy and momentum conservation can be met for the electron tunneling between materials with a conduction band offset. This is schematically shown in FIG. 7, which illustrates the conduction band offsets of the layers (as shown in FIG. 5a) along with the electron energy as a function of momentum parallel to the barriers.

The barriers confining the low band gap material in the tunneling region 25 are higher than the majority of the hot carriers created in the emitter region 24 since otherwise direct thermal emission from the emitter material 24 to the acceptor material 26 would occur. This would result in a high thermalisation loss for these carriers and lower the average energy of the carriers in the emitter material.

It is also desirable for efficient operation that the carriers photo-generated in the emitter material be within the thermalisation length of a hot carrier from the barriers, such that no substantial lattice thermalisation occurs between the carriers being photo-generated and their tunneling.

This method of carrier extraction, with the aim of energetically narrowing the carrier distribution by selective tunneling between semiconductors with a conduction band offset, can then be used in many ways. It is possible to produce a current using this method anywhere where there is a difference in electron temperature between two semiconductor regions. This can be seen in equation 4, which is a simple extension of the Tsu-Esaki formula for the current in a resonant tunneling diode for the case of different electron temperatures in the emitter material and acceptor material.

$$J(V) = \frac{m_e e k_B T_2}{2\pi^2 \hbar^3} \int_0^\infty dE_z T(E_z) \ln\left[\frac{1 + \exp\left(\frac{(E_{f1} - E_z)}{k_B T_1}\right)}{1 + \exp\left(\frac{(E_{f2} - E_z - eV)}{k_b T_2}\right)}\right] \quad \text{Equation 4}$$

It is clear that if $T_1 > T_2$ then a current will flow from region 1 to region 2 even for the case of zero applied voltage. This current will transport electrons from the hotter semiconductor material to the colder semiconductor material and if the colder semiconductor material has a wider band gap than the hotter material then it is possible that the reduction in temperature is not at the expense of a drop in the average electron energy.

More generally and in accordance with description already provided, the technical features of the present invention include one or more of the following:

A non-majority carrier resonant tunneling structure comprising at least the layers of:
an emitter semiconductor material, a first barrier layer, a second barrier layer, an energy selectively transmissive interface, e.g. quantum well layer (or a stack of energy selective interfaces) arranged between the first and second barrier layers, and an acceptor semiconductor material, as shown in FIG. 5a.

Figure 5B:
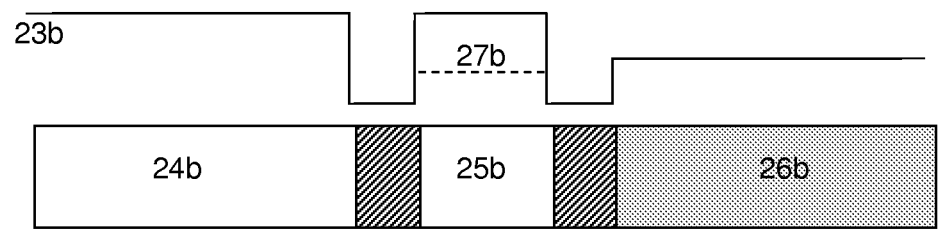

A non-majority carrier resonant tunneling structure is defined here as one that permits tunneling of minority or intrinsic carriers across the junction. FIGS. 5a and 5b show band diagram schematics of a conduction band and valence band non-majority resonant tunneling structure respectively.

The band gap of the emitter material ($Eg_1$) is less than the band gap of the acceptor material ($Eg_2$).

The emitter material should absorb light and generate electrons and holes

The conduction (valence) band edge of the emitter material has a lower (higher) energy than the conduction (valence) band edge of the acceptor material for the case of electrons (holes) as the non-majority carriers.

The quantum well layer provides an energy level that supports resonant tunneling at an electron (hole) energy greater than (less than) the conduction (valence) band edge of the acceptor material for the case of electrons (holes) as the non-majority carriers.

The non-majority carrier effective mass of the acceptor material is greater than that of the emitter material.

Furthermore, the device in accordance with the present invention may include the following optional features The barrier height may be at least higher than the average energy of the photo-generated non-majority carriers.

The minority carrier effective mass may be substantially less than the majority carrier mass for the material in which light absorption takes place. "Substantially less than" in the context of the minority carrier effective mass means the minority carrier mass is less than half the majority carrier mass, such that more than two-thirds of the hot-carrier energy goes into the minority carrier distribution.

The non-majority carrier band edge of the acceptor material may be substantially aligned to the average non-majority hot carrier energy in the emitter. They must be substantially well aligned such that resonant carrier transfer occurs from the average non-majority hot carrier energy in the emitter to the band edge energy of the acceptor (while allowing for momentum conservation). To allow this resonant carrier transfer, substantially well aligned energy levels are within $k_BT$ of each other, where T is the lattice (phonon) temperature.

The resonant tunneling energy and the non-majority band edge of the acceptor material may be substantially well aligned, so as to allow resonant carrier transfer to the acceptor material band edge (while allowing for momentum conservation). The emitter material size may be smaller than the hot-carrier thermalisation length so that energy selective extraction of hot carriers from the emitter material is possible.

The acceptor material promotes efficient radiative recombination, such that the rate of radiative recombination is on the same scale as the tunneling rate of carriers into the acceptor material.

The acceptor material suppresses radiative recombination (e.g. indirect band gap)

Embodiments are detailed in the following pages to give examples of the use of energetic narrowing of an electronic distribution by selective tunneling between semiconductors with a conduction band offset in accordance with the invention.

Figure 8:
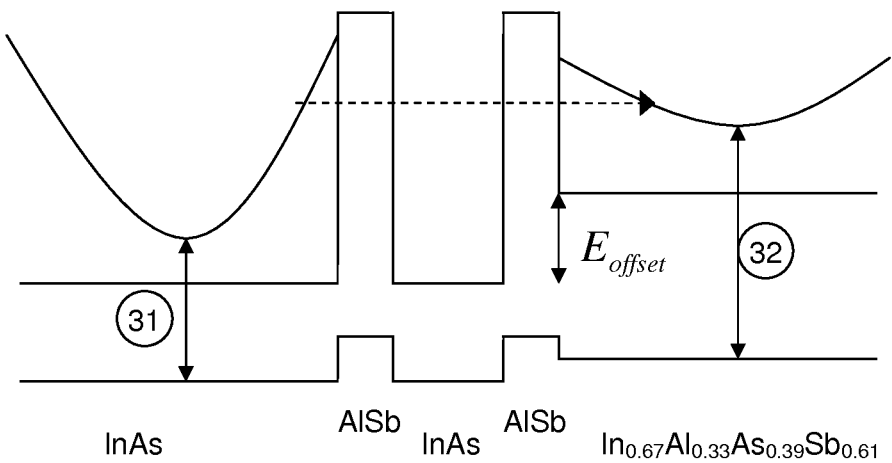
FIG. 8 The band structure of a device in accordance with the present invention, showing the materials and band line-up FIG. 9 An illustration of a device in accordance with the present invention, showing a nanowire design to allow absorption direction and tunneling direction to be decoupled.

Embodiment 1. The band structure shown in FIG. 8 illustrates one embodiment using a tunneling scheme between a lower band gap material and higher band gap material in accordance with the invention. In this embodiment both the emitter material 31 and the acceptor material 32 are substantially un-doped (i.e. the concentration of impurity dopants in the emitter material 31 and the acceptor material 32 is less than the concentration of photo-generated electrons ($\rho$), given by equation 3). Electrons are generated in the emitter material but not the acceptor material, for example, by illuminating the device but shading the acceptor material or focusing light on the emitter material. In this way a hot carrier distribution is created in the conduction band of the emitter material and selective tunneling takes place in to the acceptor material. The acceptor material is designed such that fast radiative decay of the electrons is favourable, for example by the acceptor material being a direct band-gap material and having a laser cavity structure that supports stimulated emission of photons at the acceptor band gap energy. In this way a broadband light input incident on the emitter material is re-emitted as a substantially monochromatic output from the acceptor material. Substantially monochromatic light refers to a light spectrum that is energetically narrower than $k_BT$, where $k_B$ is boltzmann's constant and T is the temperature of operation for the device detailed in this embodiment.

InAs is used as the emitter material 31 because of its narrow band gap and low electron mass. AlSb is used for the barriers because it is lattice matched to InAs and has a very large conduction band offset (2.1 eV). A quaternary material $In_xAl_{1-x}As_ySb_{1-y}$ is used for the acceptor material 32, since it is both lattice matched to InAs and AlSb and also has a larger electron mass than InAs. A further benefit of this quaternary material is that its band gap (and hence conduction band offset) can be tuned by changing the values of x and y. Yet another favourable feature of this materials system is that there is only a very small offset in the valence bands of the different semiconductors (InAs, AlSb, $In_xAl_{1-x}As_ySb_{1-y}$), so direct hole transport may take place without tunneling. This will allow the recombination of electrons and holes in the acceptor material without the necessity of designing the device to allow hole tunneling as well as electron tunneling. It should be clear that many other combinations of materials are possible to give the low band gap emitter, high band gap barrier and intermediate band-gap acceptor that are utilized for this device. These could include, but are not limited to: Ge or SiGe, $SiO_2$ and Si; GaAs, AlAs and $Al_xGa_{1-x}As$; InAs, AlAs and InGaAs; InGaN, AlN and GaN.

Figure 9:
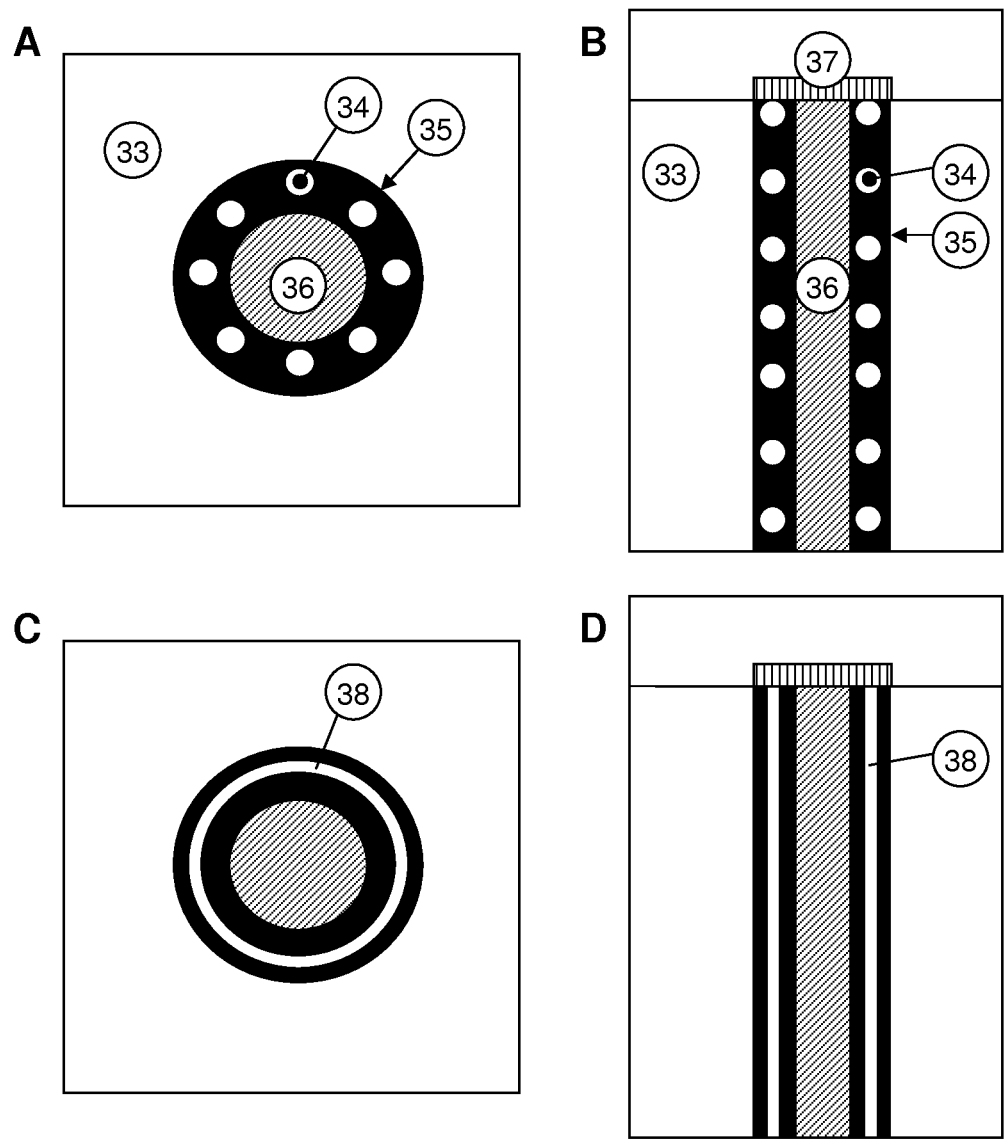

Embodiment 2. A structure as shown in FIG. 9 was designed and modeled to exploit the tunneling scheme from a low band gap material to a high band gap material as detailed in embodiment 1. The device is shown parallel to the direction of illumination in FIG. 9A and perpendicular to this direction in FIG. 9B. The illustration shows a nanowire device whereby absorption of light takes place in the InAs emitter material 33, the re-emission is from the $In_xAl_{1-x}As_ySb_{1-y}$ acceptor material 36 which is a cylindrical nanowire, and resonant tunneling takes place through a layer of InAs Quantum dots 34 within an AlSb layer 35 which is concentric to the nanowire. This could equally be carried out with concentric layers of AlSb/InAs/AlSb as shown in FIGS. 9C and 9D, in which tunneling takes place through the concentric InAs quantum well layer 38. To increase the tunneling rate the acceptor material 36 could be capped with a reflective or absorptive material 37 in order to prevent carriers being photogenerated there. This nanowire geometry was used in order to decouple the direction of light absorption from the direction of tunneling. In this way a high percentage of the incident light is absorbed (because the nanowire length can be made to be of the order of the absorption depth for a given wavelength of light) while the photo-generated electrons are still within the thermalisation length of the barrier through which they tunnel.

Figure 10:
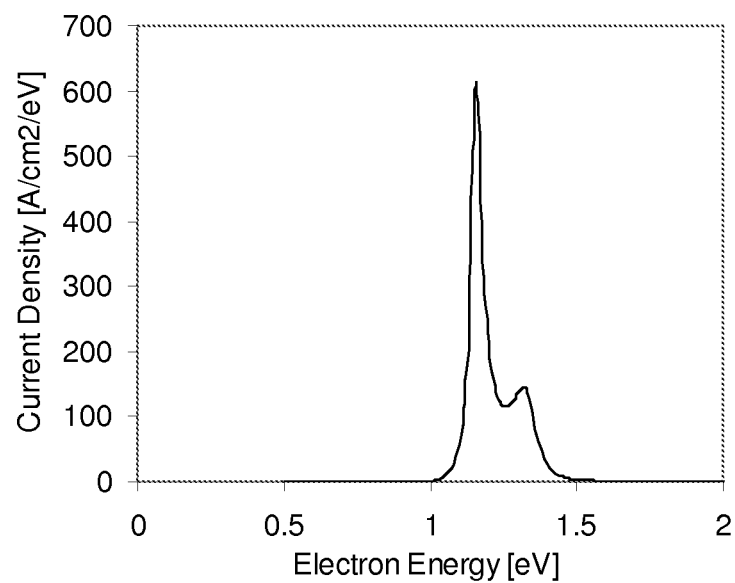
FIG. 10 The tunneling current density as a function of electron energy for the tunneling from the emitter material to the acceptor material in the nanowire structure.

An efficiency for this process was obtained by modeling this system with rate equations representing the key processes in the system: light absorption in the emitter 33, lattice thermalisation, carrier thermalisation and tunneling. The tunnel current was calculated by using a transfer matrix method to obtain the transmission coefficient T for a given electron energy E and then using this to calculate the current of electrons passing from the emitter material to the acceptor material in an energy interval E→E+dE. The tunnel current, as a function of energy, for the device in accordance with the invention is shown in FIG. 10. This shows the significantly narrowed energy distribution for the electrons in the acceptor material (in comparison with the hot electron distribution in the emitter material). The power output from the radiative decay of the electrons in the acceptor material was then divided by the power input from the concentrated sunlight that we used in this model. This resulted in a 60% efficiency for this process.

Figure 13:
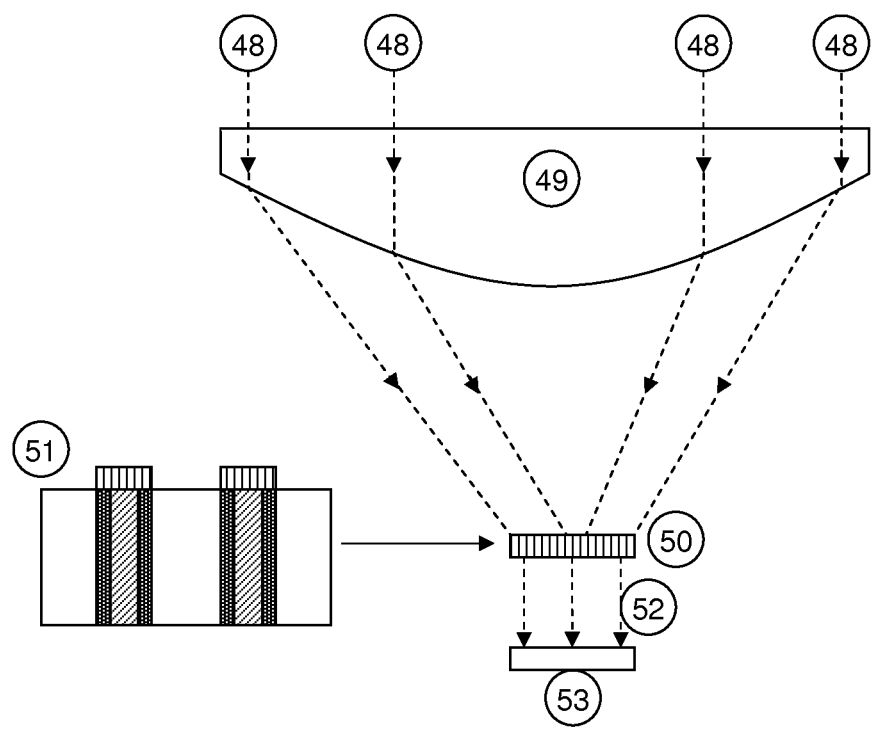
FIG. 13 A schematic illustration of a use of the resonant tunneling structure of a device in accordance with the present invention, whereby broadband light 48 is concentrated by an optic 49 onto the resonant tunneling structure 50 and the substantially monochromatic light 52 emitted from the resonant tunneling structure illuminates a matched photovoltaic cell 53.

Embodiment 3. In a third embodiment a monochromatic light-emitting device, as detailed, for example, in embodiment 2, is coupled to a matched photovoltaic cell (e.g., the photovoltaic cell is spectrally matched to the monochromatic spectrum) so as to illuminate the photovoltaic cell with light of an energy substantially matched to the photovoltaic cell's band gap. Light of energy substantially matched to the photovoltaic cell's bandgap means the emitted monochromatic spectrum and band gap energy of the photovoltaic cell are matched sufficiently so as to minimize energy loss by thermalisation while still being able to be absorbed by the photovoltaic cell. That is, the closer it is to the band edge, but not below, the better. This is schematically illustrated in FIG. 13, where a broadband source 48 illuminates a concentration optic 49, e.g. a lens, which focuses light onto the resonant tunneling structure of the device 50 in accordance with the present invention, which is also shown magnified 51. This resonant tunneling structure emits substantially broadband light 52 on to a photovoltaic cell 53 with a band gap matched to the energy of the monochromatic light. Since the largest losses in a photovoltaic cell are thermalisation of carriers created from photons with energies in excess of the band gap and non-absorption of photons with energies beneath the band gap, this illumination with substantially monochromatic light can result in very efficient electrical conversion in the matched photovoltaic cell.

Figure 11:
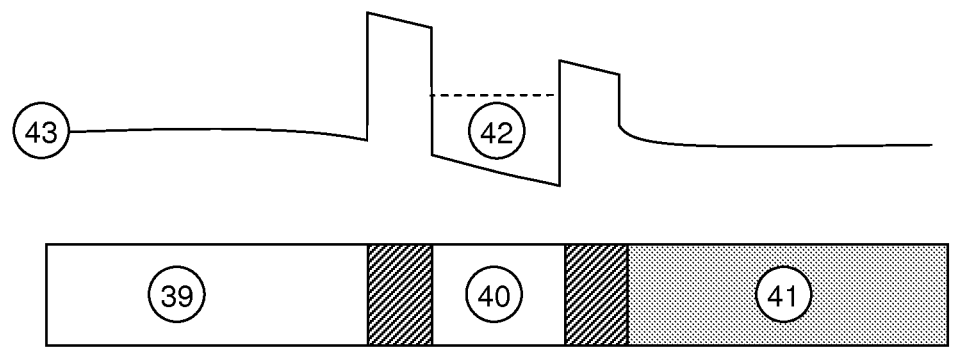
FIG. 11 Conduction band structure and layer structure for the resonant tunneling structure of a device in accordance with the present invention with a p-doped emitter material and an offset n-doped acceptor material.

Embodiment 4. The band structure and material layer schematic shown in FIG. 11 illustrate a fourth embodiment of the device in accordance with the invention, whereby an energy selective contact 40 at a certain energy 42 exists between a p-doped emitter material 39 and an n-doped acceptor material 41 with the conduction band energy profile shown by 43. As previously, the acceptor material has a larger band gap than the emitter material.

Figure 12:
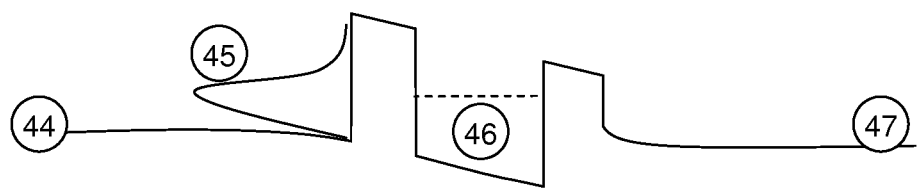
FIG. 12 Conduction band structure for the resonant tunneling structure of a device in accordance with the present invention with a p-doped emitter material and an offset n-doped acceptor material showing an illustration of the hot carrier distribution generated in the p-doped emitter material.

With further reference to FIG. 12, hot carriers are photo-generated in the p-doped emitter material 45 and selectively tunnel at a certain energy 46 in to the n-doped acceptor material 47. The n-doped acceptor material can be shaded, or light focused on the p-doped region, to stop a hot carrier distribution being created in the acceptor material. The device can then be biased, as in a conventional p-n junction solar cell, and current extracted. Similar materials systems and structures (e.g. FIG. 9) can be employed as were in embodiment 1, though electrical contact with the emitter material 44 and acceptor material 47 is now utilized. This device differs markedly from the standard "hot carrier solar cell" (as per e.g. JP04324214) in that its energy selective region is at the interface between an n and a p doped semiconductor region rather than at the contacts of the device.

Embodiment 5. In a fifth embodiment the device as detailed in embodiment 1 is altered such that instead of the acceptor material promoting fast radiative decay, the carriers are electrically extracted from the acceptor material. Shading the acceptor material or focusing light on the emitter material creates the electron (or hole) temperature gradient required to drive a current from the emitter material to the acceptor material (as per Equation 4). The device can then be biased to extract power from this current, with the requirement that the carrier density at the selective tunneling energy must be lower in the acceptor material (created by impurity doping) than the emitter material (created by photo-excitation).

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

INDUSTRIAL APPLICABILITY

This device could be used in the realisation of a photovoltaic system with ultra-high efficiency (>50%). It could be used to create monochromatic light from a broadband source (e.g. the sun). Further, this could be used to illuminate a photovoltaic cell, resulting in high efficiency. It could also be used in an implementation of a hot carrier solar cell.

What is claimed is:
1. A resonant tunneling device comprising:
   a first semiconductor material with an energy difference between valence and conduction bands of Eg1;
   a second semiconductor material with an energy difference between valence and conduction bands of Eg2, wherein Eg1 and Eg2 are different from one another; and
   an energy selectively transmissive interface connecting the first and second semiconductor materials,
   wherein one of the first or second semiconductor materials comprises an emitter material and the other of the first or second semiconductor materials comprises an acceptor material, and the energy difference between the valence and conduction bands for the emitter material is less than the energy difference between the valence and conduction bands for the acceptor material, and
   wherein a thickness of the emitter material is smaller than a hot thermalization length from a region where energy selective extraction takes place.
2. The device according to claim 1, wherein an electron mass of the acceptor material is greater than an electron mass of the emitter material.
3. The device according to claim 1, wherein the emitter material absorbs light and generates electrons and holes.
4. The device according to claim 1, wherein when electrons are a non-majority carrier, a conduction band edge of the emitter material has a lower energy than a conduction band edge of the acceptor material, and when holes are the non- majority carrier, the valence band edge of the emitter material has a higher energy than the valence band edge of the acceptor material.

5. The device according to claim 4, wherein when electrons are the non-majority carrier the energy selectively transmissive interface provides an energy level that supports resonant tunneling at an electron energy greater than the conduction band edge of the acceptor material, and when holes are the non-majority carrier the energy selectively transmissive interface provides an energy level that supports resonant tunneling at a hole energy less than the valence band edge of the acceptor material.

6. The device according to claim 1, wherein a non-majority carrier band edge of the acceptor material is substantially aligned to an average non-majority hot carrier energy in the emitter material.

7. The device according to claim 1, wherein the acceptor material suppresses radiative recombination.

8. The device according to claim 1, wherein the energy selectively transmissive interface comprises a first barrier layer arranged adjacent to the first semiconductor material, a second barrier layer arranged adjacent to the second semiconductor material, and a quantum well layer arranged between the first and second barrier layers.

9. The device according to claim 1, wherein a minority carrier effective mass is substantially less than a majority carrier effective mass for the semiconductor material that absorbs light.

10. The device according to claim 1, wherein a valence and/or conduction band of the first semiconductor material is offset from a respective valence or conduction band of the second semiconductor material.

11. The device according to claim 1, wherein carriers are electrically extracted from the first and second semiconductor material to an external circuit.

12. The device according to claim 1, wherein the energy selectively transmissive interface is arranged between the first and second semiconductor materials.

13. The device according to claim 1, wherein the emitter and acceptor materials are substantially undoped, and the acceptor region is a direct band-gap material having a structure that supports efficient radiative recombination.

14. The device according to claim 13, wherein the emitter material comprises InAs and the acceptor material is a quaternary material.

15. The device according to claim 1, wherein an offset between the valance bands of the semiconductor materials is selected to enable direct hole transport without tunneling.

16. The device according to claim 1, wherein carriers are electrically extracted from the acceptor material.

17. The device according to claim 1, wherein the first semiconductor material is InAs and the second semiconductor material is $In_xAl_{1-x}As_ySb_{1-y}$.

18. The device according to claim 17 wherein the energy selectively transmissive interface is a quantum well of InAs between two layers of AlSb.

19. The device according to claim 1, wherein the energy selective transmissive interface comprises a stack of energy selective transmissive interfaces.

* * * * *